United States Patent
Wu et al.

(10) Patent No.: US 11,086,214 B2
(45) Date of Patent: Aug. 10, 2021

(54) MASK PLATE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Siquan Wu, Beijing (CN); Xinjie Zhang, Beijing (CN); Hao Chen, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 189 days.

(21) Appl. No.: 15/761,639

(22) PCT Filed: Sep. 11, 2017

(86) PCT No.: PCT/CN2017/101225
§ 371 (c)(1),
(2) Date: Mar. 20, 2018

(87) PCT Pub. No.: WO2018/082396
PCT Pub. Date: May 11, 2018

(65) Prior Publication Data
US 2020/0264504 A1   Aug. 20, 2020

(30) Foreign Application Priority Data
Nov. 1, 2016 (CN) .......................... 201621175982.9

(51) Int. Cl.
*G03F 1/50* (2012.01)
*G03F 1/54* (2012.01)

(52) U.S. Cl.
CPC . *G03F 1/50* (2013.01); *G03F 1/54* (2013.01)

(58) Field of Classification Search
CPC ..................................... G03F 1/50; G03F 1/54
See application file for complete search history.

(56) References Cited

U.S. PATENT DOCUMENTS

| 2002/0110753 | A1* | 8/2002 | Pforr | ......................... G03F 1/29 |
| | | | | 430/311 |
| 2006/0199114 | A1 | 9/2006 | Sekiya et al. | |
| 2010/0330468 | A1* | 12/2010 | Kwon | ....................... G03F 1/50 |
| | | | | 430/5 |
| 2016/0252806 | A1* | 9/2016 | Wang | ....................... G03F 1/54 |
| | | | | 430/5 |

FOREIGN PATENT DOCUMENTS

| CN | 103676465 A | 3/2014 |
| CN | 104407496 A | 3/2015 |
| CN | 104423084 A | 3/2015 |
| CN | 106054531 A | 10/2016 |
| CN | 206133181 U | 4/2017 |

OTHER PUBLICATIONS

International Search Report and Written Opinion for Application No. PCT/CN2017/101225, dated Dec. 7, 2017, 12 Pages.

* cited by examiner

*Primary Examiner* — Stewart A Fraser
(74) *Attorney, Agent, or Firm* — Brooks Kushman P.C.

(57) ABSTRACT

A mask plate is provided according to the present disclosure. The mask plate includes: a fully-transparent region; a fully-opaque region; and a partially-transparent region at a boundary between the fully-transparent region and the fully-opaque region.

10 Claims, 4 Drawing Sheets ously illustrated clearly and completely in conjunction
MASK PLATE

CROSS-REFERENCE TO RELATED APPLICATIONS

This application is the U.S. national phase of PCT Application No. PCT/CN2017/101225 filed on Sep. 11, 2017, which claims priority to Chinese Patent Application No. 201621175982.9 filed on Nov. 1, 2016, which are incorporated herein by reference in their entireties.

TECHNICAL FIELD

The present disclosure relates to the field of display technologies, in particular to a mask plate.

BACKGROUND

A thin film transistor circuit on an array substrate of a current liquid crystal display panel is of a multi-layer structure, and the circuits in different layers need to be connected through a via hole. In actual production, due to a large gradient slope of a border (profile) of the via hole, circuit open (step open) may occur when an ITO (Indium tin oxide) electrode layer is deposited, which causes a variety of display problems. In such a manner, a product yield significantly decreases, and thus the production cost increases.

A slope angle of the via hole may be reduced to some degree by improving an exposure dose on an edge of the via hole. However, the via hole formed by increasing the exposure dose has a larger CD (Critical Dimension), which does not meet the design requirements.

SUMMARY

Embodiments of the present disclosure provide technical solutions as follows.

A mask plate is provided according to the present disclosure. The mask plate includes: a fully-transparent region; a fully-opaque region; and a partially-transparent region at a boundary between the fully-transparent region and the fully-opaque region. The partially-transparent region corresponds to a boundary slope of an opening pattern formed with a mask, and the light is partially transmitted through the partially-transparent region.

Optionally, the partially-transparent region includes a light-diffraction structure through which a light diffraction phenomenon occurs when the light is transmitted.

Optionally, the light-diffraction structure includes a plurality of diffraction bumps arranged at intervals along a boundary line between the the fully-transparent region and the fully-opaque region.

Optionally, a gap between two adjacent diffraction bumps is a first gap arranged in such a manner as to enable a light diffraction phenomenon to occur between the two adjacent diffraction bumps, and the first gap is smaller than a resolution of an exposure machine used in a mask process.

Optionally, each of the diffraction bumps is of a triangle shape, and the plurality of diffraction bumps are arranged in a serrated form, and a distance between two adjacent diffraction bumps gradually decreases in a direction from the fully-transparent region to the fully-opaque region.

Optionally, the diffraction bump and the fully-opaque region of the mask plate are made of an identical material and form an integrated structure.

Optionally, the light-diffraction structure includes a diffraction light-shielding ring, the diffraction light-shielding ring surrounds the boundary line between the fully-transparent region and the fully-opaque region, and a second gap is formed between the diffraction light-shielding ring and an edge of the fully-opaque region.

Optionally, the second gap is arranged in such a manner as to enable a light diffraction phenomenon to occur when the light is transmitted through the second gap, and the second gap is smaller than a resolution of an exposure machine used in a mask process.

Optionally, the diffraction light-shielding ring is of a fully-opaque rectangular or annular structure made of a material identical to the fully-opaque region.

Optionally, the partially-transparent region includes a semi-transparent film at the boundary between the fully-transparent region and the fully-opaque region.

DETAILED DESCRIPTION

In order to make the object, technical solutions and advantages of embodiments of the present disclosure clearer, technical solutions of the embodiments of the present disclosure are illustrated clearly and completely in conjunction with drawings of the embodiments of the present disclosure. Apparently, the described embodiments are merely a few rather than all of the embodiments of the present disclosure. All other embodiments obtained by persons of ordinary skill in the art based on the embodiments of the present disclosure without creative efforts shall fall within the protection scope of the present disclosure.

Figure 1:
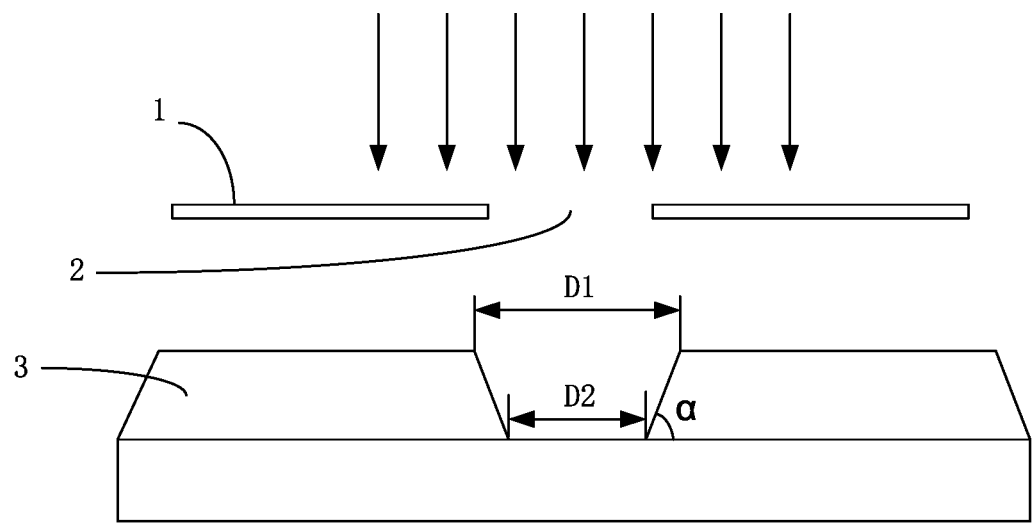
FIG. 1 is a schematic diagram of a mask plate forming a via hole.

FIG. 1 is a schematic diagram of a mask plate forming a via hole in the related art. As shown in FIG. 1, in the related art, an opening is formed on a mask plate 1 mainly through a laser to form a transparent region 2. In the normal exposure, the energy density of the light transmitted through the transparent region 2 of the mask plate 1 is normally distributed, that is, the middle density is large and the edge density is small. Therefore, the photoresist (PR) 3 corresponding to a middle region of the transparent region 2 is fully exposed, and the photoresist (PR) 3 corresponding to an edge region of the transparent region 2 is partially exposed, so that a conical via hole is formed, and an edge chamfer of the via hole is of a slope angle α.

According to a formula tan α=2T/(D1−D2), in the case of a constant thickness T of the PR, the slope angle of the edge of the via hole is decreased only in a manner of appropriately increasing the exposure dose, which makes a light energy density curve become flat. However, the via hole formed in the manner of increasing the exposure dose may have a larger CD (Critical Dimension), which does not meet design requirements.

In order to solve the above problem, a mask plate is provided according to embodiments of the present disclosure, an opening pattern (such as a via hole) is formed through the mask plate, and a slope profile at a boundary of the opening pattern formed through the mask plate is improved on the basis of not changing a critical dimension (CD) of the opening pattern in the original product design, so as to effectively reduce the slope angle of the boundary slope of the opening pattern, thereby improving the margin of opening pattern etching equipment, reducing adverse events occurring to an upper ITO layer, avoiding a variety of related product problems, and improving the yield.

Reference is made to FIG. 2 to FIG. 7. The mask plate according to the embodiments of the present disclosure includes: a fully-transparent region 100; a fully-opaque region 200; and a partially-transparent region at a boundary between the fully-transparent region 100 and the fully-opaque region 200. The partially-transparent region corresponds to a boundary slope 11 of the opening pattern formed with a mask, and the light is partially transmitted through the partially-transparent region.

According to the mask plate of the present disclosure, the partially-transparent region is arranged at the boundary between the fully-transparent region 100 and the fully-opaque region 200. The partially-transparent region enables a part of the light to transmit therethrough, which may weaken the energy of the transmitted light, and since the energy of the transmitted light through the partially-transparent region is weakened, the photoresist 20 located at the boundary of the formed opening pattern (the via hole 10 as shown in the FIG. 2) is partially exposed. Compared with the related art, a slope angle of the boundary slope 11 of the via hole 10 may be decreased. As a result, on the basis of not changing a critical dimension (CD) of the opening pattern in the original product design, a profile of the slope 11 at the boundary of the opening pattern may be improved, and the exposure energy at the edge of the opening pattern is reduced, thereby improving the margin of opening pattern etching equipment, reducing adverse events occurring to an upper ITO layer, avoiding a variety of related product problems, and improving the yield.

It should be noted that the photoresist 20 may be a positive photoresist or a negative photoresist. In the case that the photoresist 20 is a positive photoresist, the via hole 10 is formed corresponding to the fully-transparent region 100 with the mask, and in the case that the photoresist 20 is a negative photoresist, the via hole 10 is formed corresponding to the fully-opaque region 200 with the mask.

It should also be noted that the opening pattern may be a via hole or other opening patterns.

Hereinafter the present disclosure will be described in detail by taking an example that the photoresist 20 is a positive photoresist, and the opening pattern is a via hole.

Figure 2:
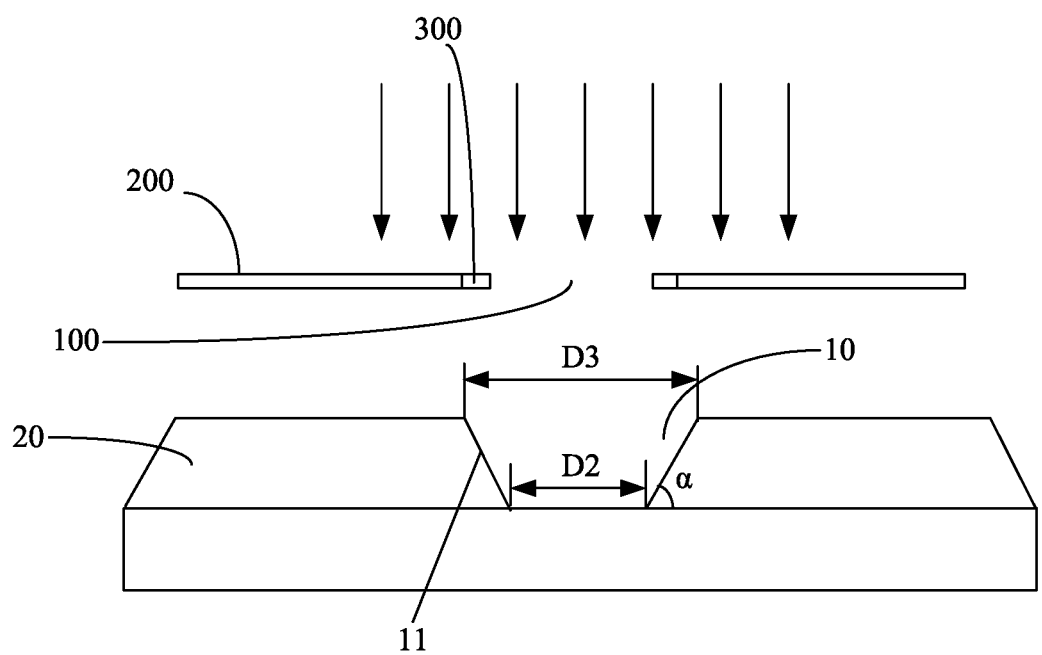
FIG. 2 is a schematic diagram showing the forming of a via hole with a mask plate according to an embodiment of the present disclosure.

The partially-transparent region may be a light-diffraction structure which enables a light diffraction phenomenon to occur when the light is transmitted through the light-diffraction structure, and a size of the fully-transparent region 100 on the mask plate may be slightly larger than a size of the fully-transparent region 2 of the mask plate in the related art as shown in FIG. 1 (i.e., the size D3 in FIG. 2 is slightly larger than the size D1 in FIG. 1). An exposure dose is appropriately increased during the exposure, a light diffraction occurs when the light transmitted through the partially-transparent region due to the light-diffraction structure of the partially-transparent region, and the light energy is weakened, which causes the photoresist 20 at the boundary of the via hole 10 to be partially exposed, thereby reducing the slope angle of the boundary slope 11 of the via hole 10.

In addition, the partially-transparent region may also be a semi-transparent film arranged at the boundary between the fully-transparent region 100 and the fully-opaque region 200, and the CD size of the fully-transparent region 100 on the mask plate may be slightly larger than a size of the fully-transparent region 2 of the mask plate in the related art as shown in FIG. 1. The exposure dose is appropriately increased during an exposure, and the energy of the light transmitted through the semi-transparent film of the partially-transparent region is weakened due to the light-diffraction structure of the partially-transparent region, which causes the photoresist 20 at the boundary of the via hole 10 to be partially exposed, thereby reducing the slope angle of the boundary slope 11 of the via hole 10.

It should be appreciated that, in practical applications, the partially-transparent region may also enable a part of the light to be transmitted in other ways, which is not limited herein.

Specifically, the following three optional embodiments are also provided in the embodiments of the present disclosure.

Figure 3:
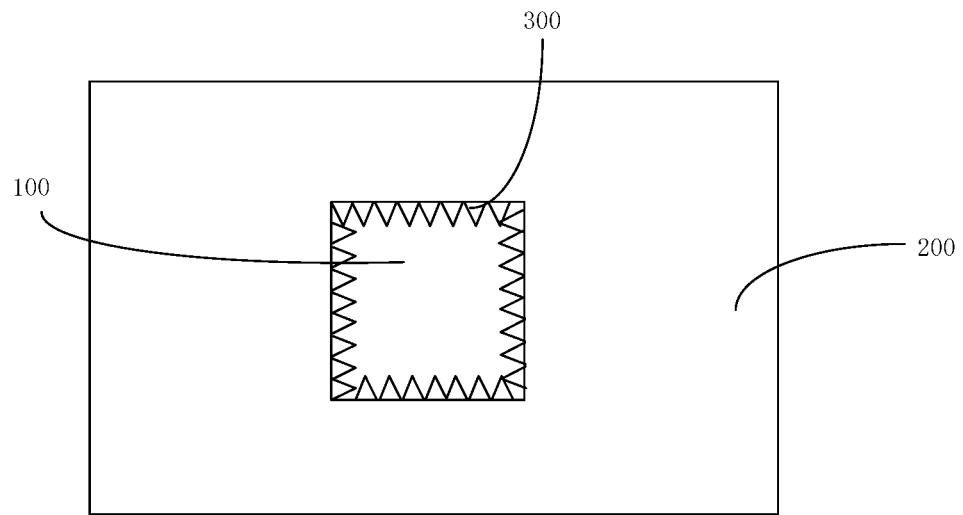
FIG. 3 is a top view of the mask plate in FIG. 2.

FIG. 2 and FIG. 3 each is a schematic diagram of a mask plate according to an embodiment of the present disclosure.

As shown in FIG. 2 and FIG. 3, the mask plate includes: a fully-transparent region 100; a fully-opaque region 200; and a partially-transparent region at a boundary between the fully-transparent region 100 and the fully-opaque region 200. The partially-transparent region corresponds to a boundary slope 11 of a via hole formed with a mask, and the light is partially transmitted through the partially-transparent region.

A light-diffraction structure is used in the partially-transparent region. The light-diffraction structure includes: a plurality of diffraction bumps 300 arranged at intervals along a boundary line between the the fully-transparent region 100 and the fully-opaque region 200.

Optionally, a gap between two adjacent diffraction bumps 300 is a first gap arranged in such a manner as to enable a light diffraction phenomenon to occur between the two adjacent diffraction bumps 300, and the first gap is smaller than a resolution of an exposure machine used in a mask process. The first gap may also be referred to as a first gap.

According to the above solutions, the gap between the adjacent diffraction bumps 300 is smaller than the resolution of the exposure machine. Due to the light diffracting action, there is a certain transparency under the diffractive bump 300, and the photoresist 20 cannot be completely resolved. Therefore, the slope 11 formed at the boundary of the via hole 10 is relatively gentle.

In the embodiment, optionally, as shown in FIG. 3, each of the diffractive bumps 300 is of a triangle shape, the plurality of diffraction bumps 300 are arranged in a serrated form, and a distance between two adjacent diffraction bumps 300 gradually decreases in a direction from the fully-transparent region 100 to the fully-opaque region 200.

According to the above solutions, the boundary of the fully-transparent region 100 and the fully-opaque region 200 is designed to be a serrated structure, that is, a serrated light-diffraction structure, the light is diffracted when transmitted through the serrated structure, and the light energy proximate to the serrated structure is weakened, which enables the photoresist 20 at the edge of the via hole 10 to be partially exposed, thereby reducing the slope angle of the boundary slope 11 of the via hole 10.

It should be noted that in the other embodiments, the diffractive bump 300 may also be of another shape, for example, a rectangle or the like, and the specific shape of the diffractive bump 300 is not limited herein.

In addition, in the embodiment, optionally, as shown in FIG. 3, the diffraction bump 300 and the fully-opaque region 200 of the mask plate are made of an identical material and form an integrated structure.

According to the above solution, the diffraction bump 300 may be integrally with the fully-opaque region 200 of the mask plate, and thus the fabrication process is simple.

It should be noted that, in the other embodiments of the present disclosure, the diffraction bump 300 and the fully-opaque region 200 of the mask plate may also be made of different materials. For example, the diffraction bump 300 may be made of a semi-transparent material.

Figure 4:
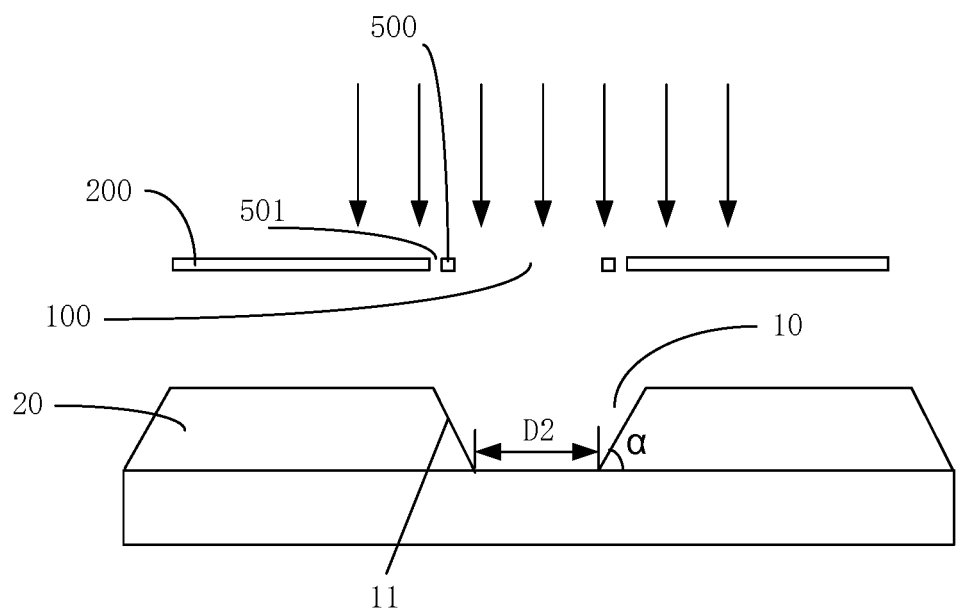
FIG. 4 is a schematic diagram showing the forming of a via hole with a mask plate according to an embodiment of the present disclosure.
Figure 5:
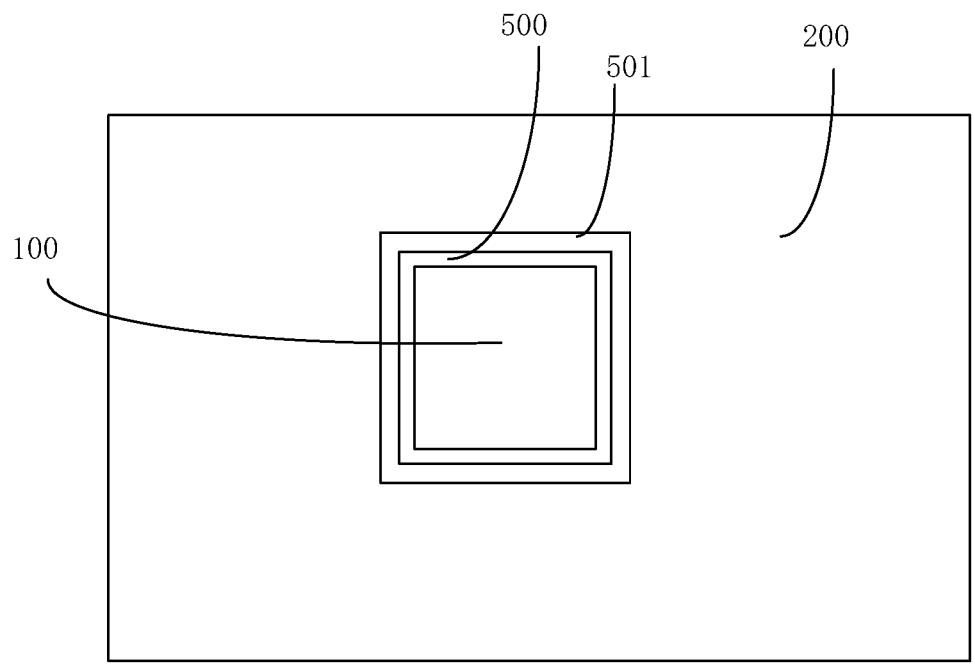
FIG. 5 is a top view of the mask plate in FIG. 4.

FIG. 4 and FIG. 5 each is a schematic diagram of a mask plate according to another embodiment of the present disclosure.

As shown in FIG. 4 and FIG. 5, the mask plate includes: a fully-transparent region 100; a fully-opaque region 200; and a partially-transparent region at a boundary between the fully-transparent region 100 and the fully-opaque region 200. The partially-transparent region corresponds to a boundary slope 11 of a via hole formed with a mask, and the light is partially transmitted through the partially-transparent region.

A light-diffraction structure is used in the partially-transparent region. The light-diffraction structure includes: a diffraction light-shielding ring 500, the diffraction light-shielding ring 500 surrounds a boundary line between the fully-transparent region 100 and the fully-opaque region 200, and a second gap 501 is formed between the diffraction light-shielding ring 500 and an edge of the fully-opaque region 200. Optionally, the second gap 501 is arranged in such a manner as to enable a light diffraction phenomenon to occur when the light is transmitted through the second gap 501, and the second gap 501 is smaller than a resolution of an exposure machine used in a mask process. The second gap may also be referred to as a second gap.

Figure 8:
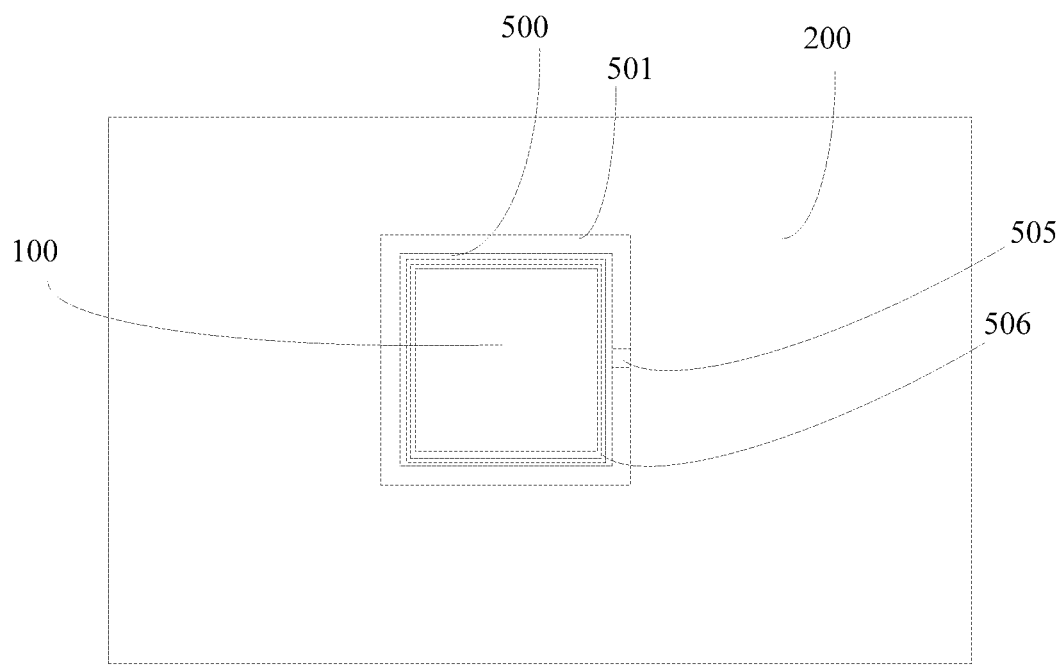
FIG. 8 is a top view of a mask plate according to an embodiment of the present disclosure.

In an embodiment, as shown in FIG. 8, the diffraction light-shielding ring 500 may be connected to the full-opaque region 200 through at least one connection block 505.

According to the above solution, the diffraction light-shielding ring 500 is arranged at the boundary between the fully-transparent region 100 and the fully-opaque region 200, and a gap between the diffraction light-shielding ring 500 and the fully-opaque region 200 may enable a light diffraction phenomenon to occur when the light is transmitted through the gap, which weakens the light energy, and causes the photoresist 20 at the edge of the via hole 10 to be partially exposed, thereby reducing the slope angle of the boundary slope 11 of the via hole 10.

It should be noted that in other embodiments, an annular gap 506 may be further provided (as shown in FIG. 8) separated from the diffraction light-shielding ring 500, the gap 506 may enable the light diffraction phenomenon to occur when the light is transmitted through the gap, and a width of the gap is smaller than a resolution of an exposure machine used in a mask process.

In addition, in the embodiment, optionally, as shown in FIG. 5, the diffraction light-shielding ring 500 is of a fully-opaque rectangle or annular structure and is made of a material identical to the fully-opaque region 200 of the mask plate.

According to the above solution, the diffraction light-shielding ring 500 may be made of a material identical to the fully-opaque region 200 of the mask plate, and in fabricating, a circle of slit is patterned at a position corresponding to an inner side of the via hole 10 on the mask plate to form the diffraction light-shielding ring 500, and the fabricating process is simple.

It should be noted that, in the other embodiments of the present disclosure, the diffraction light-shielding ring 500 and the fully-opaque region 200 of the mask plate may also be made of different materials. For example, the diffraction light-shielding ring 500 may be made of a semi-transparent material.

Figure 6:
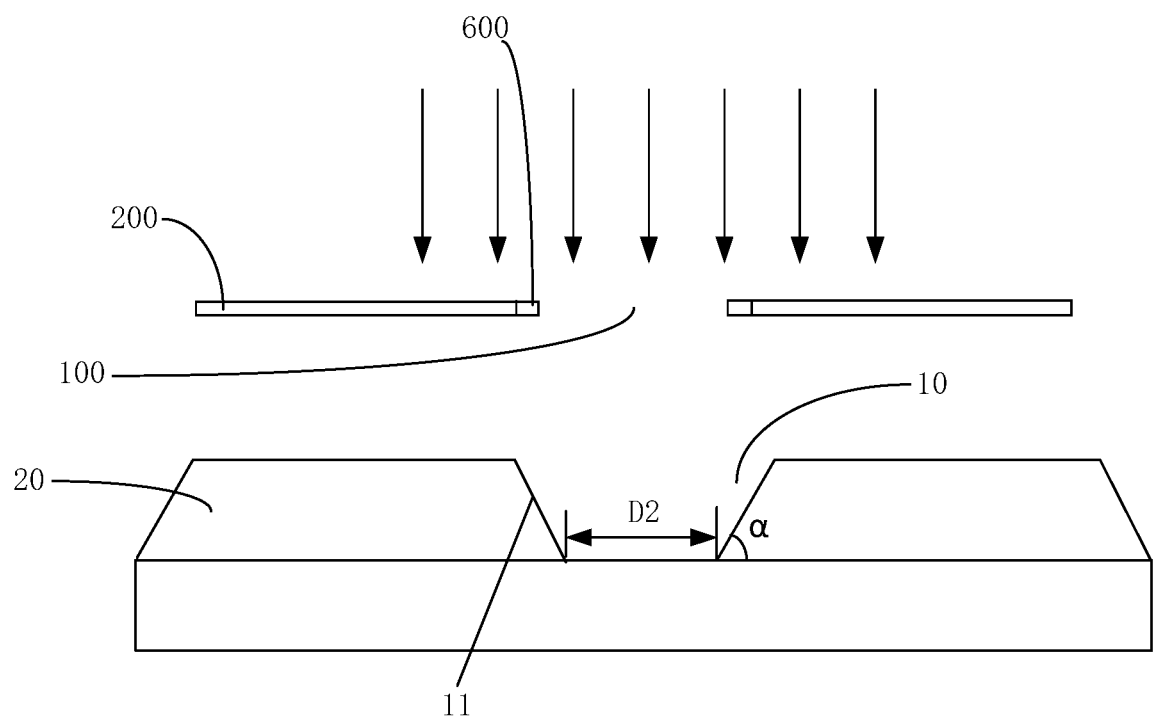
FIG. 6 is a schematic diagram showing the forming of a via hole with a mask plate according to an embodiment of the present disclosure.
Figure 7:
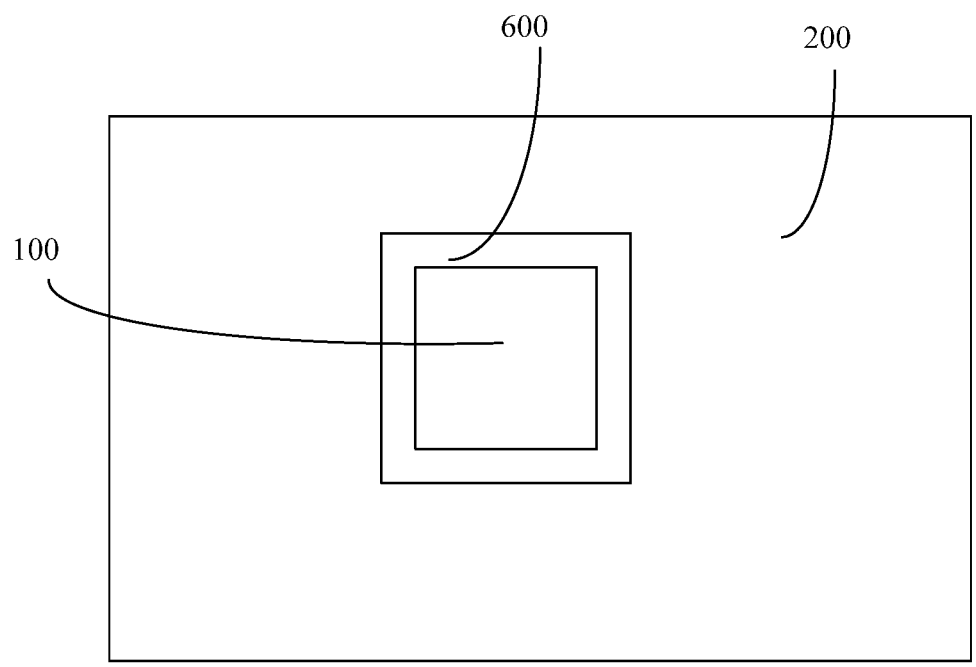
FIG. 7 is a top view of the mask plate in FIG. 6.

FIG. 6 and FIG. 7 each is a schematic diagram of a mask plate according to another embodiment of the present disclosure.

As shown in FIG. 6 and FIG. 7, the mask plate includes: a fully-transparent region 100; a fully-opaque region 200; and a partially-transparent region at a boundary between the fully-transparent region 100 and the fully-opaque region 200. The partially-transparent region corresponds to a boundary slope 11 of a via hole formed with a mask, and the light is partially transmitted through the partially-transparent region. The partially-transparent region includes a semi-transparent film 600.

According to the above solution, a circle of the semi-transparent film 600 is arranged at the boundary of the fully-transparent region 100 and the fully-opaque region 200 on the mask plate, after passing through the semi-transparent film 600, the transmitted light has a lower energy, which causes the photoresist 20 at the boundary of the via hole 10 to be partially exposed, thereby reducing the slope angle of the boundary slope 11 of the via hole 10. It should be noted that a transmittance of the semi-transparent film 600 is not limited herein, which may be ½ transparent film, ⅓ transparent film, or ⅔ transparent film.

The above descriptions are only optional embodiments of the present disclosure. It should be noted that, some improvements and substitutions can be made by those skilled in the art without departing from the principle of the present disclosure, and these improvements and substitutions shall also fall within the scope of the present disclosure.

What is claimed is:

1. A mask plate, comprising:
   a fully-transparent region;
   a fully-opaque region; and
   a partially-transparent region at a boundary between the fully-transparent region and the fully-opaque region,
   wherein the partially-transparent region comprises a light-diffraction structure,
   wherein the light-diffraction structure comprises a plurality of diffraction bumps arranged at intervals along a boundary line between the fully-transparent region and the fully-opaque region,
   wherein each of the diffraction bumps is of a triangle shape, and the plurality of diffraction bumps are arranged in a serrated form, and a distance between two adjacent diffraction bumps gradually decreases in a direction from the fully-transparent region to the fully-opaque region.

2. The mask plate according to claim 1, wherein a gap between two adjacent diffraction bumps is a first gap arranged in such a manner as to enable a light diffraction phenomenon to occur between the two adjacent diffraction bumps, and the first gap is smaller than a resolution of an exposure machine used in a mask process.

3. The mask plate according to claim 1, wherein the plurality of diffraction bumps and the fully-opaque region of the mask plate are made of an identical material and form an integrated structure.

4. The mask plate according to claim 1, wherein the plurality of diffraction bumps is made of a semi-transparent material.

5. The mask plate according to claim 1, wherein the partially-transparent region comprises a semi-transparent film at the boundary between the fully-transparent region and the fully-opaque region.

6. A mask plate, comprising:
   a fully-transparent region;
   a fully-opaque region; and
   a partially-transparent region at a boundary between the fully-transparent region and the fully-opaque region,
   wherein the partially-transparent region comprises a light-diffraction structure,
   wherein the light-diffraction structure comprises a diffraction light-shielding ring, the diffraction light-shielding ring surrounds a boundary line between the fully-transparent region and the fully-opaque region, and a gap is formed between the diffraction light-shielding ring and an edge of the fully-opaque region.

7. The mask plate according to claim 6, wherein the gap is arranged in such a manner as to enable a light diffraction phenomenon to occur between the diffraction light-shielding ring and the fully-opaque region, and the second gap is smaller than a resolution of an exposure machine used in a mask process.

8. The mask plate according to claim 6, wherein the diffraction light-shielding ring is of a fully-opaque annular structure made of a material identical to the fully-opaque region.

9. The mask plate according to claim 6, wherein the diffraction light-shielding ring is made of a semi-transparent material.

10. The mask plate according to claim 6, wherein the diffraction light-shielding ring is provided with an annular gap surrounding the boundary line of the fully-transparent region and the fully-opaque region, and a width of the gap on the diffraction light-shielding ring is smaller than a resolution of an exposure machine used in a mask process.

* * * * *